US007511271B2

(12) United States Patent
Hatano et al.

(10) Patent No.: US 7,511,271 B2
(45) Date of Patent: Mar. 31, 2009

(54) SCANNING ELECTRON MICROSCOPE

(75) Inventors: Michio Hatano, Tokyo (JP); Sukehiro Ito, Hitachinaka (JP); Shinichi Tomita, Hitachinaka (JP); Junichi Katane, Naka (JP)

(73) Assignee: Hitachi Science Systems, Ltd., Ibaraki-ken (JP)

( * ) Notice: Subject to any disclaimer, the term of this patent is extended or adjusted under 35 U.S.C. 154(b) by 327 days.

(21) Appl. No.: 11/230,642

(22) Filed: Sep. 21, 2005

(65) Prior Publication Data

US 2006/0186337 A1 Aug. 24, 2006

(30) Foreign Application Priority Data

Feb. 18, 2005 (JP) ............... 2005-041534

(51) Int. Cl.
H01J 47/00 (2006.01)
(52) U.S. Cl. ............... 250/310; 250/311; 250/306
(58) Field of Classification Search ....... 250/306–443.1
See application file for complete search history.

(56) References Cited

U.S. PATENT DOCUMENTS

| 4,786,806 A * | 11/1988 | Listl et al. ............... 250/305 |
| 4,880,976 A | 11/1989 | Mancuso et al. |
| 4,933,565 A * | 6/1990 | Yamaguchi et al. ...... 250/492.2 |
| 6,657,193 B2 * | 12/2003 | Dan et al. ............... 250/310 |
| 6,833,546 B2 * | 12/2004 | Craven et al. ............ 250/310 |
| 7,067,807 B2 * | 6/2006 | Petrov et al. ............ 250/307 |
| 2003/0080293 A1 * | 5/2003 | Dan et al. ............... 250/310 |
| 2006/0049348 A1 * | 3/2006 | Petrov et al. ............ 250/307 |

FOREIGN PATENT DOCUMENTS

| EP | 0 265 365 A2 | 4/1988 |
| JP | 09-283072 A | 10/1997 |
| JP | 2001-126655 | 5/2001 |
| JP | 2002-289129 | 10/2002 |
| JP | 2003-132830 | 5/2003 |
| WO | WO 90/04261 A1 | 4/1990 |
| WO | WO 99/39367 A1 | 8/1999 |
| WO | WO 02-05309 A1 | 1/2002 |

OTHER PUBLICATIONS

"Secondary Electron Imaging in the Variable Pressure Scanning Electron Microscope" Scanning 20, 436-441 (1998).
Communication (European Search Report) dated Apr. 29, 2008, issued in corresponding European Patent Application No. 05020939.

* cited by examiner

Primary Examiner—Jack I Berman
Assistant Examiner—Andrew Smyth
(74) Attorney, Agent, or Firm—Antonelli, Terry, Stout & Kraus, LLP.

(57) ABSTRACT

A scanning electron microscope includes an irradiation optical system for irradiating an electron beam to a sample; a sample holder for supporting the sample, arranged inside a sample chamber; at least one electric field supply electrode arranged around the sample holder; and an ion current detection electrode.

16 Claims, 9 Drawing Sheets

SCANNING ELECTRON MICROSCOPE

INCORPORATION BY REFERENCE

The present application claims priority from Japanese application JP2005-041534 filed on Feb. 18, 2005, the content of which is hereby incorporated by reference into this application.

BACKGROUND OF THE INVENTION

Among means for obtaining secondary electron images by a scanning electron microscope (hereinafter called "SEM"), this invention relates to a method for forming images by utilizing gas ionization and multiplication. Secondary electrons are multiplied in residual gas molecules around, then ionized gas ions are detected. The invention relates to an electrode which provide electrostatic field and an electrode which is utilized for ion current detection for improving quality of the secondary electron images during high speed scanning acquired by SEM.

Various methods for multiplying the secondary electrons by utilizing gas ionization and multiplication and then detecting the ion current have been attempted as image formation methods in SEM. The content of the principle of this kind is described in a paper "Secondary Electron Imaging in the Variable Pressure Scanning Electron Microscope", Scanning 20, 436-441 (1998).

As a concrete application system of this means, JP-A-2001-126655 discloses a detection system that uses a sheet-like electrode as a secondary electron collector electrode during high vacuum secondary image observation and also as an electrode which provides electrostatic field (referred as "an electric field supply electrode" hereinafter) and uses a sample holder as an electrode which is used for ion current detection (referred as "an ion current detection electrode" hereinafter). JP-A-2003-132830, on the other hand, discloses a detection system that uses a secondary electron collector electrode as an electric field supply electrode and a dedicated ion current detection electrode separate from a sample holder as an ion current detection electrode. JP-A-2002-289129 discloses a detection system that uses a sample holder as both of the electric field supply electrode and the ion current detection electrode.

FIG. 8 shows a basic construction of a detection system of SEM in JP-A-2003-132830. A primary electron beam 2 is converged by an objective lens 6 onto a sample 14 put inside a gas atmosphere and a deflector 4 two-dimensionally scans the sample 14. Secondary electrons 18 are generated from the sample 14 with the progress of irradiation of the primary electron beam 2. The secondary electrons 18 are accelerated in a direction toward an electric field supply electrode 23 by the electric field generated by this sheet-like electric field supply electrode 23 to which a positive voltage is applied. The secondary electrons 18 thereby accelerated collide with gas molecules around the sample and form electron-ion pairs (gas ionization). The secondary electrons 18 and the electrons generated by ionization are further accelerated by the electric field generated by the electric field supply electrode 23, again collide with the gas molecules and form the electron-ion pairs. As this process is repeated, the number of electrons and the number of ions increase exponentially as they come close to the electric field supply electrode 23 (gas multiplication). The scale of this gas multiplication is generally great when the drift distance of the secondary electrons (distance between sample and electric field supply electrode) is great. The ions drift towards the ion current detection electrode 22 that is electrically connected to the sample holder 16 or is electrically insulated from the sample holder 16. The drifting ions are detected as an ion current. The resulting ion current signal is passed through an amplifier 19 and an A/D converter 31 and is used for image formation. The electric field supply electrode 23 shown hereby is used as a secondary electron collector electrode at the time of observation of high vacuum secondary electron images.

FIG. 9 is an enlarged view of an electric field supply electrode 23 and a sample holder 16 of an electron microscope in JP-A-2001-12655. The secondary electrons 18 emitted from the sample surface create a large number of ions due to gas multiplication in the proximity of the electric field supply electrode 23. The resulting ions 13 drift towards the sample holder 16 (ion current detection electrode) to which a ground potential or a negative voltage is applied, and are detected as an ion current from the sample holder 16. The current signal so obtained is passed through an amplifier 19 and an A/D converter 31 and is used for image formation. The electric field supply electrode 23 hereby shown is used also as a secondary electron collector electrode at the time of observation of vacuum secondary images.

FIG. 10 is an enlarged view of portions in the proximity of a sample holder 16 of an electron microscope in JP-A-2002-289129. The secondary electrons 18 emitted from the sample surface drift towards an objective lens 6 kept at a ground potential by the electric field created by the sample holder 16 to which a negative voltage is applied, and generate a large number of ions in the proximity of the objective lens 6 by gas multiplication. The resulting ions are detected as an ion current from the sample holder 16. The resulting current signal is passed through an amplifier 19 and an A/D converter 31 and is used for image formation.

SUMMARY OF THE INVENTION

To improve the image forming speed and image quality in the gas multiplication system ion current detection type SEM, it is necessary to simultaneously accomplish improvement of the response speed of the current signal by reducing the drift time, improvement of the ion multiplication time by the electron avalanche and increase of the ion current yield by improving detection efficiency of ions.

In JP-A-2001-126655 (FIG. 9), the space defined by the sample holder as the ground potential and the electric field supply electrode to which the positive potential is applied is the drift space of the electrons and the ions. Since the electron avalanche exponentially increases in the process in which the electrons drift inside the gas atmosphere, a large number of ions occur at positions far from the sample holder (ion current detection electrode). Therefore, the drift time in which the ions occurring in the gas atmosphere reach the ion current detection electrode gets elongated and yet sufficient examinations have not necessarily been made as to speed-up of the response speed of the current signal used for the formation of the SEM image.

On the other hand, the greater the yield of the ion current, the greater becomes the improvement of image quality of the SEM image. The yield of the ion current is determined by the multiplication ratio of the ions by the electron avalanche and by detection efficiency of the ion current detection electrode. It is known that the multiplication ratio of the ions becomes generally greater when the drift distance of the secondary electrons becomes greater. For example, the means described in JP-A-2001-126655 (FIG. 9) and the means described in JP-A-2003-132830 (FIG. 8) set the distance (drift distance) between the sample surface as the secondary electron generation surface and the electric field supply electrode to a suitable distance and can optimize the ion multiplication ratio to a certain extent. According to the means of JP-A-2002-289129, however, the working distance (hereinafter called "W.D.") results as such in the drift distance of the secondary electrons and when W.D. is small, a sufficient ion multiplication ratio cannot be obtained.

The ion multiplication ratio becomes greater when the potential gradient for accelerating the secondary electrons becomes greater. Therefore, it can be said that the ion multiplication ratio is dependent on the potential gradient created by the electric field supply electrode, too. However, the means of the prior art described above do not sufficiently take optimization of the shape of the electric field supply electrode into consideration for improving the ion multiplication ratio.

In a gas multiplication system ion current detection type SEM, SEM according to the invention includes at least one electric field supply electrode arranged around a sample holder and an ion current detection electrode so arranged as to cover the former.

According to such a construction, an SEM image can be acquired in the following way, for example. The primary electron beam emitted and accelerated from an electron gun is converged onto a sample by a condenser lens and an objective lens. An irradiation point of the primary electron beam on the sample is scanned by a deflector with the converging operation. The secondary electrons emitted from the sample with the irradiation of the primary electron beam are multiplied by applying a suitable voltage to the electric field supply electrode. The ions multiplied in this process are detected as an ion current from an ion current detection electrode. Because the ion current detection electrode has the shape that covers the electric field supply electrode, the ions generated in the proximity of the electric field supply electrode can be efficiently detected. Because the distance between the electric field supply electrode and the ion detection electrode is smaller than that of the electrode arrangement in the prior art technologies, the response speed owing to the drift time can be shortened.

In those SEM which form images from an ion current containing secondary electron information by utilizing secondary electron multiplication by residual gas molecules around a sample, the invention can improve a response speed of a detection system and an ion yield in comparison with the prior art technologies.

Other objects, features and advantages of the invention will become apparent from the following description of the embodiments of the invention taken in conjunction with the accompanying drawings.

DESCRIPTION OF THE EMBODIMENTS

Embodiment 1

Figure 1:
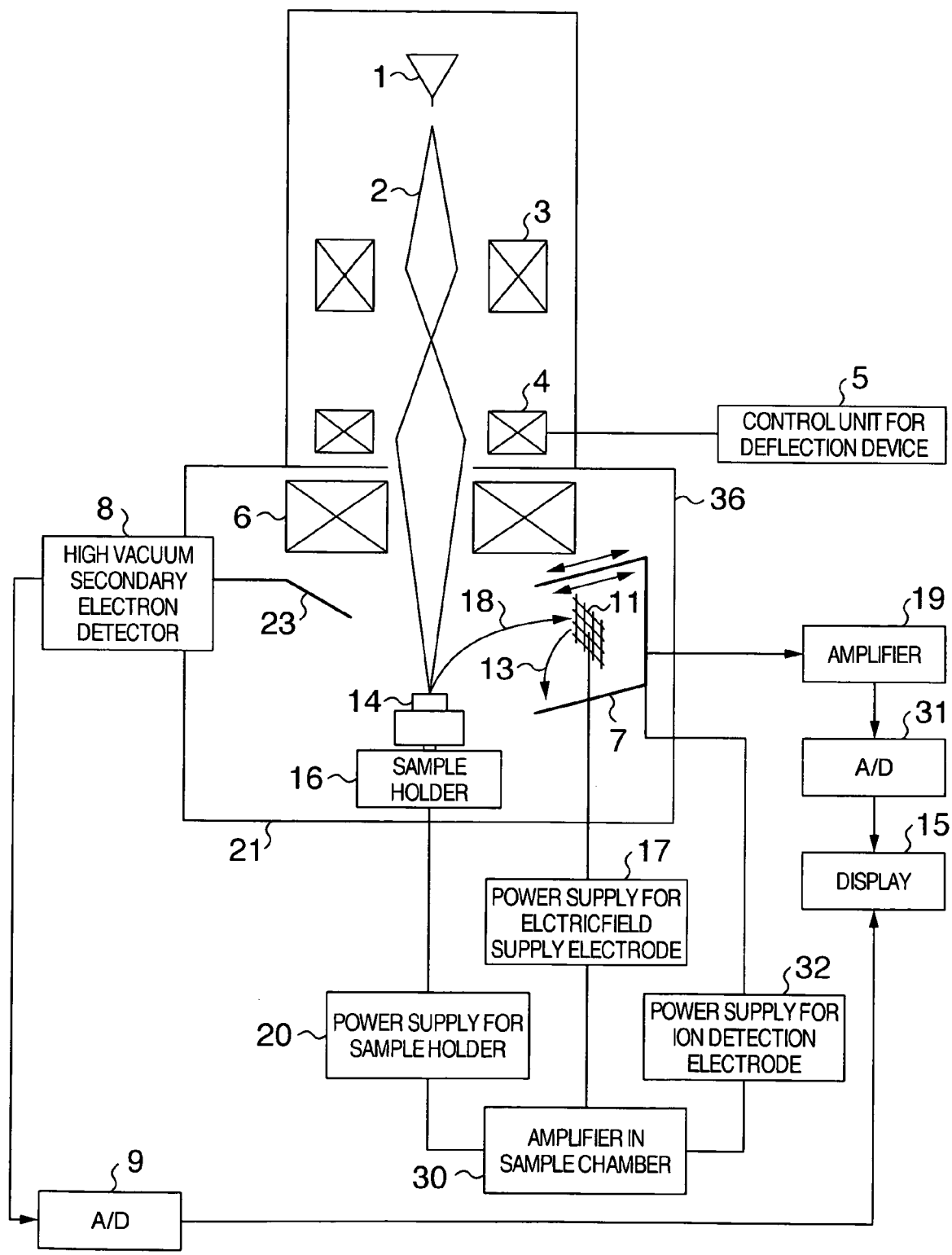
FIG. 1 shows an SEM according to a first embodiment of the invention.

FIG. 1 shows an SEM according to an embodiment of the invention. As an operation of an irradiation optical system, a primary electron beam 2 emitted from an electron gun 1 is converged by an objective lens 6 onto a sample 14 positioned inside a gas atmosphere (typically, a gas pressure of 1 to thousands of Pa) inside a vacuum chamber 36 and the sample 14 is scanned by a deflector 4. Secondary electrons 18 are generated from the sample 14 with the irradiation of the primary electron beam 2. The secondary electrons 18 are accelerated by an electric field created by a mesh-like electric field supply electrode 11 (with typical mesh parameters of a mesh pitch of 1,250 µm and a mesh wire diameter of 200 µm) to which a positive voltage (typically, 1 to about 500 V) is applied and by a sample holder 14 to which a negative voltage (typically, 0 to about −50 V) is applied. The secondary electrons 18 so accelerated impinge against gas molecules around the sample and form electron-ion pairs. The secondary electrons 18 and the electrons generated by ionization are accelerated by the electric field created by the electric field supply electrode 11 and the sample holder 16 and again ionize the gas molecules. As this process is repeated, the electron avalanche occurs and the number of electrons and the number of ions increase exponentially as they come close to the electric field supply electrode 11.

The ions drift towards an ion current detection electrode 7 that is grounded, and are detected as an ion current. The resulting current signal is amplified by an amplifier 19 and is used for image formation through an A/D converter 31.

The ion current detection electrode 7 has an upper electrode and a lower electrode and these electrodes are kept at the same potential. To improve ion detection efficiency, a negative voltage (typically, −10 to 0 V) may be applied to the ion current detection electrode 7.

An adjustment mechanism may be arranged so that the ion current detection electrode 7 and the electric field supply electrode 11 interposed between the upper and lower electrodes while being covered can slide independently, and either manually or automatically, close to and away from the sample holder. These electrodes are moved either manually or automatically by a controller. When charging of the sample affects the image, the charge of the sample can be offset by controlling the distance between the ion current detection electrode 7 or the electric field supply electrode 1 and the sample 11 to thereby control the quantity of the ions or electrons approaching the sample holder. When the sample is charged to the negative by the irradiation of the primary electron beam, for example, the quantity of the ions approaching the sample surface is increased by moving the ion current detection electrode 7 away from the sample 14. The ions offset the negative charge of the sample surface and reduce the charge of the sample surface. In this case, the yield of the ion current is controlled by adjusting the voltage applied to the electric field supply electrode 11 and the distance between the electric field supply electrode 11 and the sample 14. When the sample 14 is charged to the positive by emission of the secondary electrons, the electric field supply electrode 11 is brought close to the sample so that the major proportion of the electrons gas-multiplied approaches the sample surface. The electrons offset the positive charge of the sample surface and reduce its charge. In this case, the yield of the ion current is controlled by adjusting the voltage applied to the electric field supply electrode 11 and the relative distance between the ion current detection electrode 7 and the sample 14. When W.D. is changed, too, the distance between the sample surface and each electrode can be kept constant by adjusting the positional relation of each electrode, and the degree of the charge of the sample surface, the yield of the ion current and the drift distance can be kept constant.

A voltage control mechanism 30 controls the voltages applied to the sample holder 16, the electric field supply electrode 11 and the ion detection electrode 7, respectively.

Optimization of the parameters for image observation such as a gas pressure, W.D., etc, is made by adjusting either manually or automatically so that the ion current attains maximum.

The gas pressure is controlled by inputting a desired value to the controller (not shown). Control is made by opening and closing valves while the vacuum pump is operated. Optimization is conducted by applying a high voltage to the electric field supply electrode 11 within the range in which discharge does not take place, and regulating the gas pressure. When it is desired to conduct measurement with higher resolution, it is necessary to shorten W.D. and to lower the gas pressure.

A positive voltage (typically, 1 to 500 V) is applied to the secondary electron collector electrode 23 when observation is made by setting the sample chamber 36 to a high vacuum state (typically, about $10^{-2}$ to about $10^{-5}$ Pa). In this case, a high vacuum secondary electron detector 8 including a scintillator, an optical guide and a photomultiplier is used for the measurement of the secondary electrons.

Figure 2:
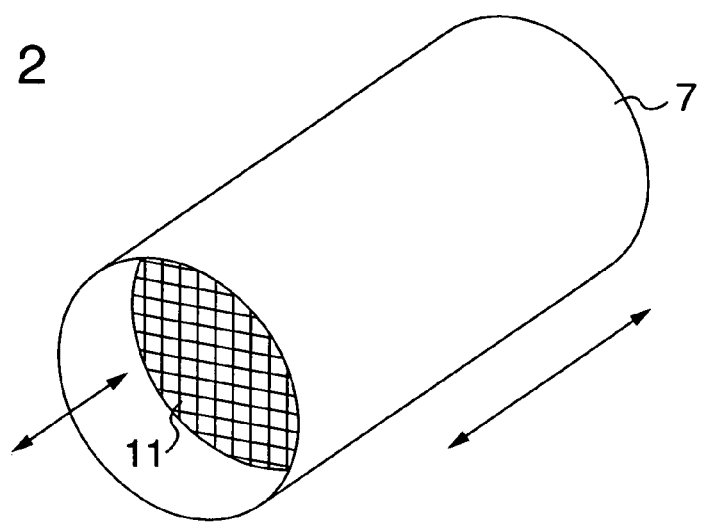
FIG. 2 shows a first example of an ion detection electrode of SEM and an electric field supply electrode according to the invention.

FIG. 2 shows by an enlarged view an example of the ion current detection electrode 7 and the electric field supply electrode 11. In this example, the ion current absorption electrode 7 having a cylindrical shape covers the periphery of a mesh type electric field supply electrode 11. In this instance, both ion current detection electrode 7 and electric field supply electrode 11 may be allowed to independently slide towards and away from the sample holder.

Figure 3:
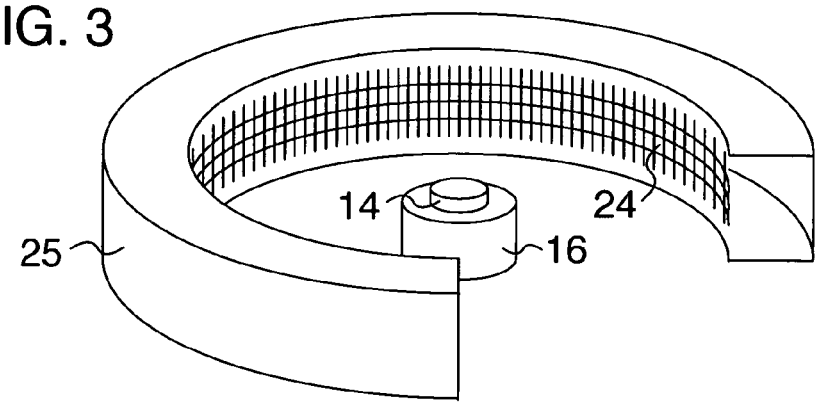
FIG. 3 shows a second example of the ion detection electrode of SEM and an electric field supply electrode according to the invention.

FIG. 3 shows another example of the ion current detection electrode and the electric field supply electrode. In this example, a sheet-like doughnut-shaped ion current detection electrode 25 (typically, having a bracket shape) covers a mesh type doughnut-shaped electric field supply electrode 24 encompassing the sample 14.

Figure 4:
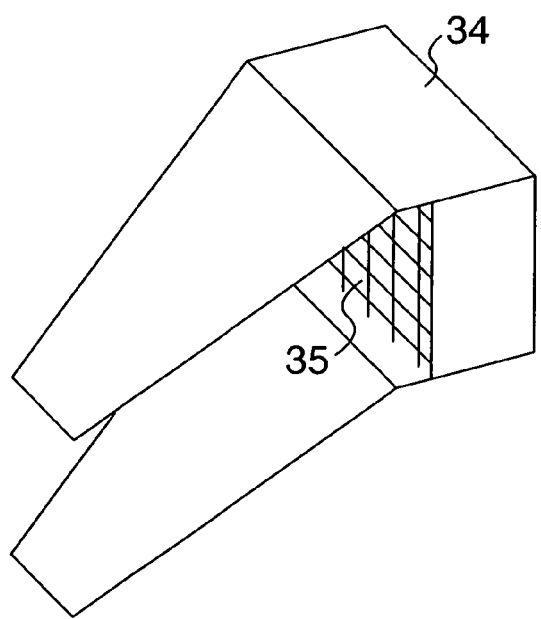
FIG. 4 shows a third example of the ion detection electrode of SEM and an electric field supply electrode according to the invention.

FIG. 4 shows still another example of the ion current detection electrode and the electric field supply electrode. In this example, a sheet-like ion current detection electrode 34 covers the periphery of a mesh type electric field supply electrode 35. The sheet shape of the ion current detection electrode 34 is such that it does not interfere with insertion of other detector to be inserted around the objective lens 6. The ion current detection electrode 34 and the electric field supply electrode 35 are used as the secondary electron collector electrode for the observation of the secondary electron image in high vacuum.

The shape of either one, or both, of the electric field supply electrode and the ion current detection electrode is a single wire, a mesh, a porous plate or a sheet-like conductor.

According to such a construction, when the electric field supply electrode has the mesh shape having thin wires of a diameter of about 200 μm, for example, electron avalanche is allowed to occur locally and effectively by the electric field having a large potential gradient that is generated in the proximity of this electrode. However, the shape of the electric field supply electrode is not limited to the thin wire shape hereby described.

Embodiment 2

Figure 5:
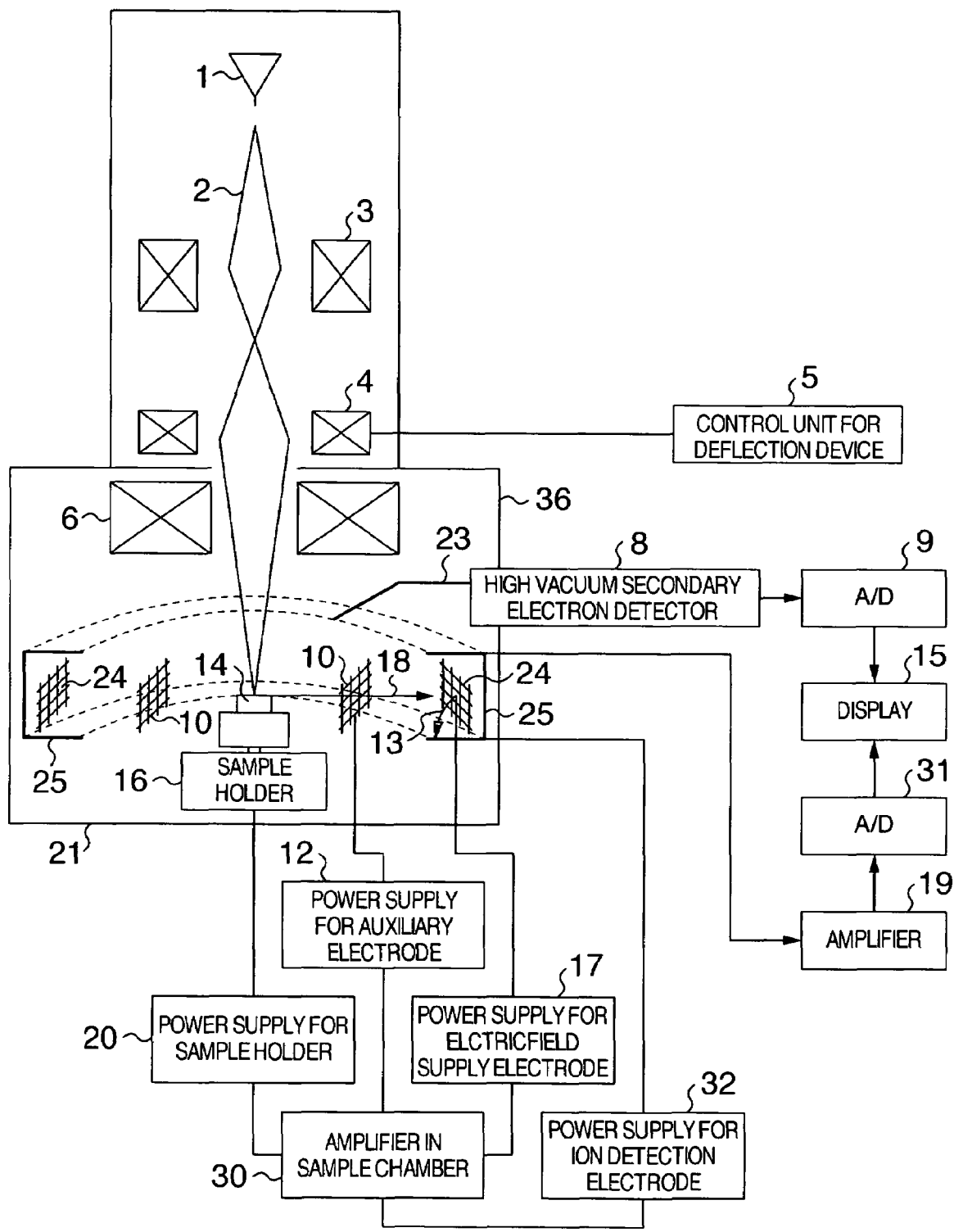
FIG. 5 shows an SEM according to a second embodiment of the invention.

FIG. 5 shows an SEM according to the second embodiment of the invention. In this detection system, a mesh type doughnut-shaped electric field supply electrode 24 encompassing the sample 14 and a sheet-like doughnut-shaped ion current detection electrode 25 (typically, having a bracket shape) covering the doughnut-shaped electric field supply electrode 24 are used as the electric field supply electrode and the ion current detection electrode in the same way as in FIG. 3. Here, the mesh pitch is 1,250 μm and the mesh wire diameter is 200 μm as the mesh parameters, for example. The doughnut-shaped electric field supply electrode 24 and the doughnut-shaped ion current detection electrode 25 are fixed to the sample holder 16. The doughnut-shaped electric field supply electrode 24 and the doughnut-shaped ion current detection electrode 25 may be fixed to a barrel. A positive voltage (typically, 1 to about 500 V) and a negative voltage (typically, −10 to about 0 V) are applied to the doughnut-shaped electric field supply electrode 24 and the doughnut-shaped ion current detection electrode 25, respectively, to let the secondary electrons drift towards the doughnut-shaped electric field supply electrode 24 and to generate the electron avalanche in the proximity of the mesh wires of the doughnut-shaped electric field supply electrode 24. To impart the initial velocity to the secondary electrons, a negative voltage (typically, −50 to 0 V) is applied to the sample holder 16.

An auxiliary electrode A10 interposed between the doughnut-like electric field supply electrode 24 and the sample holder 16 is mesh-like encompassing the sample 14 (typically, mesh pitch of 1,250 μm and mesh wire diameter of 200 μm as mesh parameters). A positive voltage (typically, 1 to 200 V) lower than the voltage of the voltage supply electrode 24 is applied to the auxiliary electrode A10 to accelerate the secondary electrons 18 towards the doughnut-shaped electric field supply electrode 24. The auxiliary electrode A10 is not limited to the mesh shape as in the case of the electric field supply electrode.

The ions amplified by the electron avalanche are attracted towards the current detection electrode 25 by the electric field and are detected as the ion current from this electrode 25. The ion current so detected is amplified by the amplifier 19, is passed through the A/D converter and is used for image formation.

The voltage control mechanism 30 controls the voltages to be applied to the sample holder 16, the doughnut-shaped ion current detection electrode 25, the doughnut-shaped electric field supply electrode 24 and the auxiliary electrode 10.

In the embodiment shown in FIG. 1, the distance between the sample 14 and the ion current detection electrode depends on W.D. Therefore, the yield of the ion current depends on W.D., too, and each voltage and the gas pressure must be optimized whenever W.D. is changed. In this embodiment, however, when the doughnut-shaped electric field supply electrode 24, the doughnut-shaped ion current detection electrode 25 and the auxiliary electrode 10 are fixed to the sample holder at the time of the change of W.D., they move simultaneously with the sample holder. Therefore, the distances between the sample 14 and the ion current detection electrode 24 and between the sample 14 and the doughnut-shaped ion current detection electrode 25 do not depend on W.D. and re-optimization need not be carried out once each voltage and the gas pressure are optimized.

Embodiment 3

Figure 6:
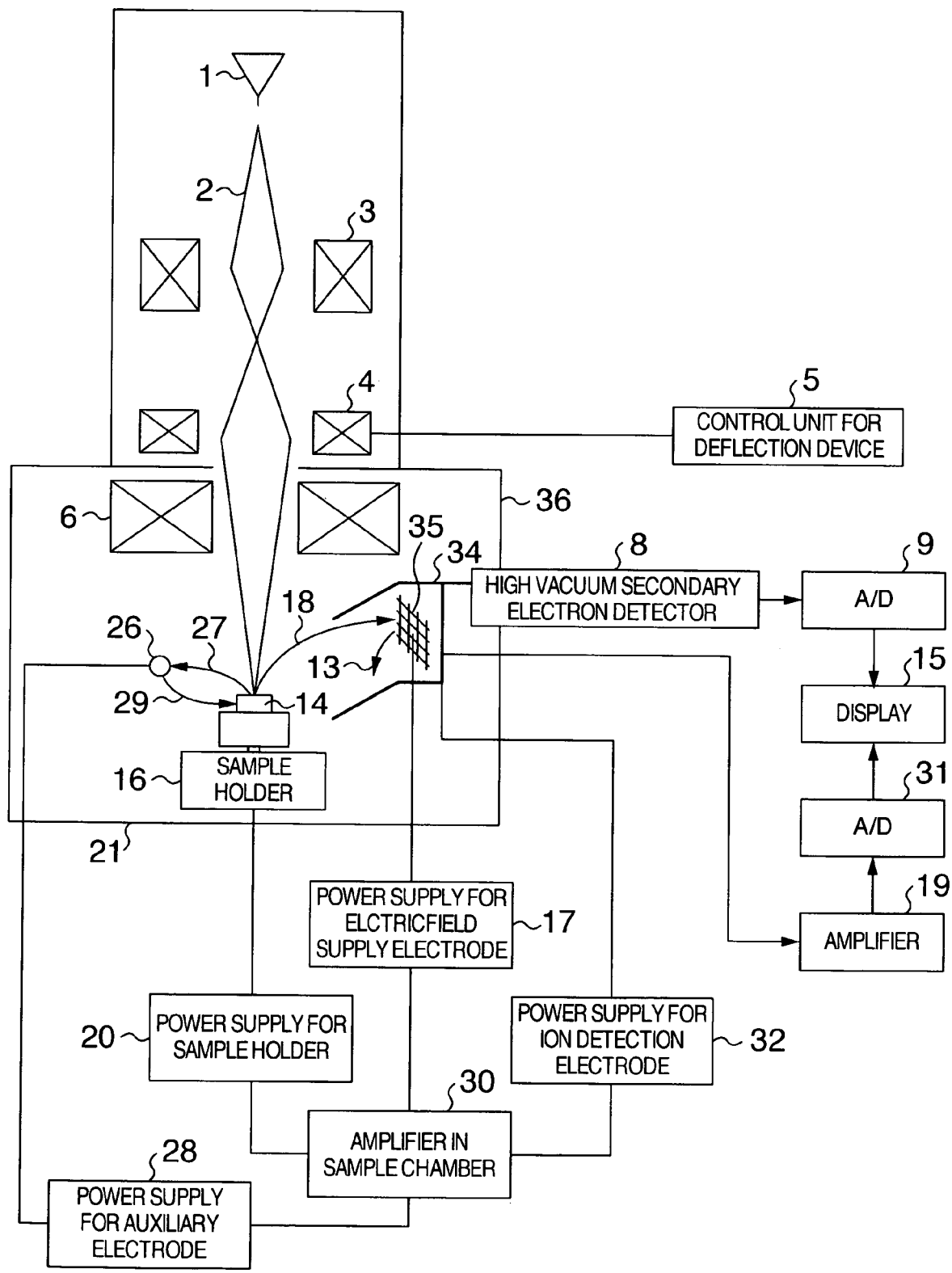
FIG. 6 shows an SEM according to a third embodiment of the invention.

FIG. 6 shows an SEM according to the third embodiment of the invention. This embodiment uses electrodes having the shapes shown in FIG. 4 for the ion detection electrode 34 and the electric field supply electrode 35 and introduces an auxiliary electrode B26 (typically, wire shape of dozens of μm). The major proportion of the secondary electrons generated from the sample 14 drifts towards the electric field supply electrode 35 but when a positive voltage (typically, 1 to 100 V) is supplied to the auxiliary electrode B26, the secondary electrons 27 that do not drift towards the electric field supply electrode 35 drift towards the auxiliary electrode B26 and ionize the molecules in the residual gas during their drift. The ions or electrons 29 generated by gas multiplication drift towards the sample 14, offset the charge in the sample 14 and reduce the charge of the sample.

The formation method of the secondary electron image is the same as those of SEM of the embodiments shown in FIGS. 1 and 5.

The voltage control mechanism 30 controls the voltage to be applied to each of the sample holder 16, the ion current detection electrode 34, the electric field supply electrode 35 and the auxiliary electrode B26.

To observe the secondary electron image inside the sample chamber at a high vacuum, the ion current detection electrode 34 or the electric field supply electrode 35 is used as the secondary electron collector electrode. The high vacuum secondary electron detector 8 detects the secondary electrons collected by the secondary electron collector electrode. Because the ion current detection electrode 34 or the electric field supply electrode 35 is used also as the secondary electron collector, each component can be mounted in a space saving arrangement.

Embodiment 4

Figure 7:
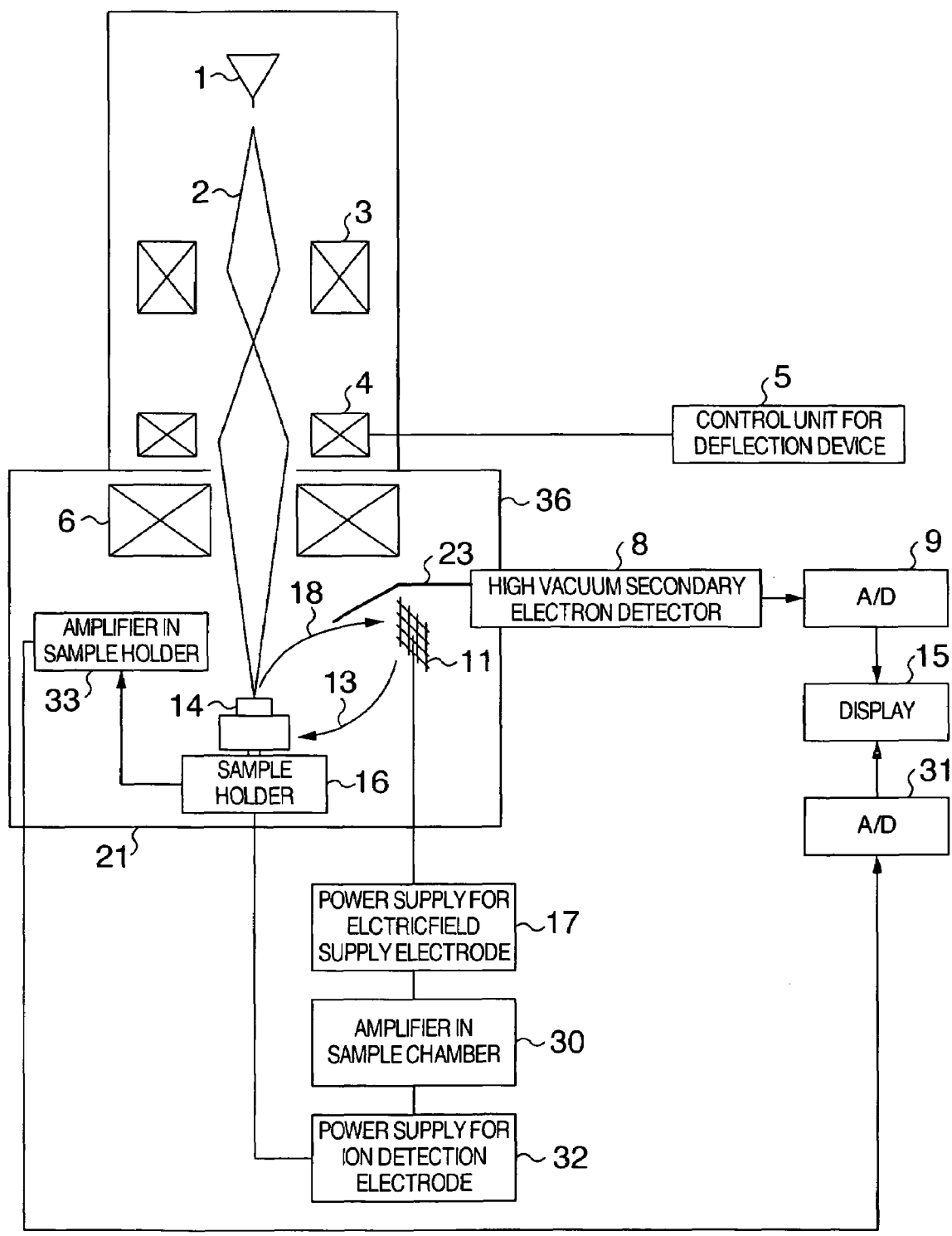
FIG. 7 shows an SEM according to a fourth embodiment of the invention.
Figure 8:
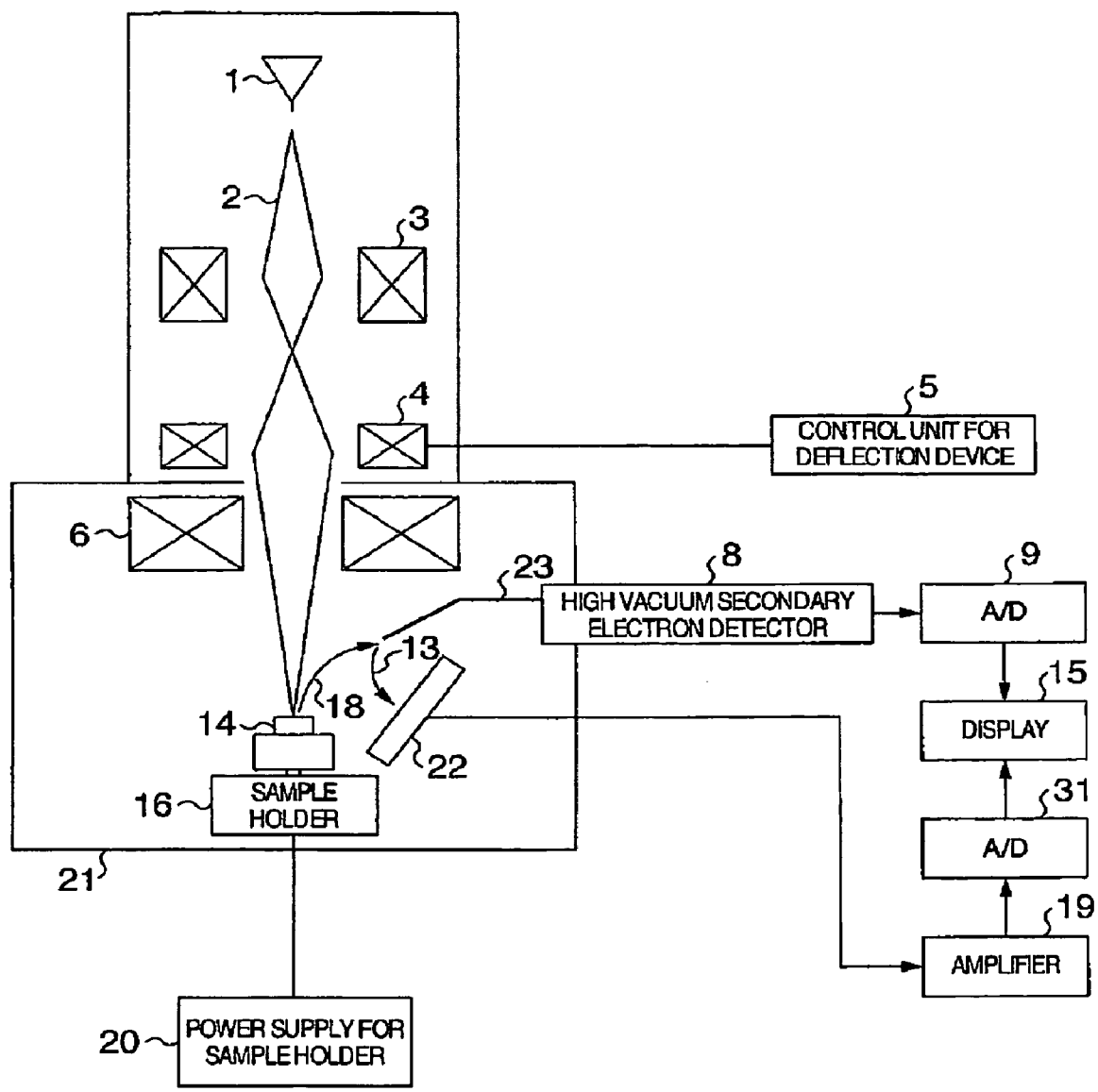
FIG. 8 shows a construction of SEM according to the prior art.

FIG. 7 shows SEM according to the fourth embodiment of the invention. This embodiment uses the mesh-like electric field supply electrode 11 similar to the electric field supply electrode 11 shown in FIG. 2 as the electric field supply electrode and uses the sample holder 16 as the ion detection electrode. Here, the mesh pitch is 1,250 μm and the mesh wire diameter is 200 μm, for example, as the mesh parameters. Because the sample holder 16 is used also as the ion detection electrode, the ions drifting towards the sample holder 16 can be detected, too, and detection efficiency can be improved. The secondary electrons 18 generate the electron avalanche in the proximity of the electric field supply electrode 11 and the multiplied ions drift towards the sample holder 16 to which a negative potential (typically, −10 to 0 V) is applied. The ion current detected from the sample holder 16 is amplified by the amplifier 33 inside the sample chamber, passes through the A/D converter 31 and is used for image formation. Because the amplifier is arranged inside the sample chamber, the distance between the ion detection electrode and the amplifier can be shortened and background noise can be reduced. The voltage control mechanism 30 controls the voltages applied to the sample holder 16 and the electric field supply electrode 11.

To observe the secondary electron image at a high vacuum, the electric field supply electrode 11, too, is used as the secondary electron collector electrode in addition to the secondary electron collector electrode 23.

The modes of the detection system according to the invention are not limited to only the four embodiments described above. For example, when W.D. is great (15 mm or more, for example), the electric field supply electrode 11 and the ion current detection electrode 7 similar to those used in the first embodiment shown in FIG. 1 are used and when W.D. is smaller (10 mm, for example), the doughnut-shaped electric field electrode 24 and the doughnut-shaped ion current detection electrode 25 similar to those used in the embodiment shown in FIG. 5 are used. When W.D. is further smaller (5 mm or below, for example), the sample holder 16 is used conjointly as the ion current detection electrode in the same way as in the embodiment shown in FIG. 7, and all these modes are embraced in the scope of the invention.

Figure 9:
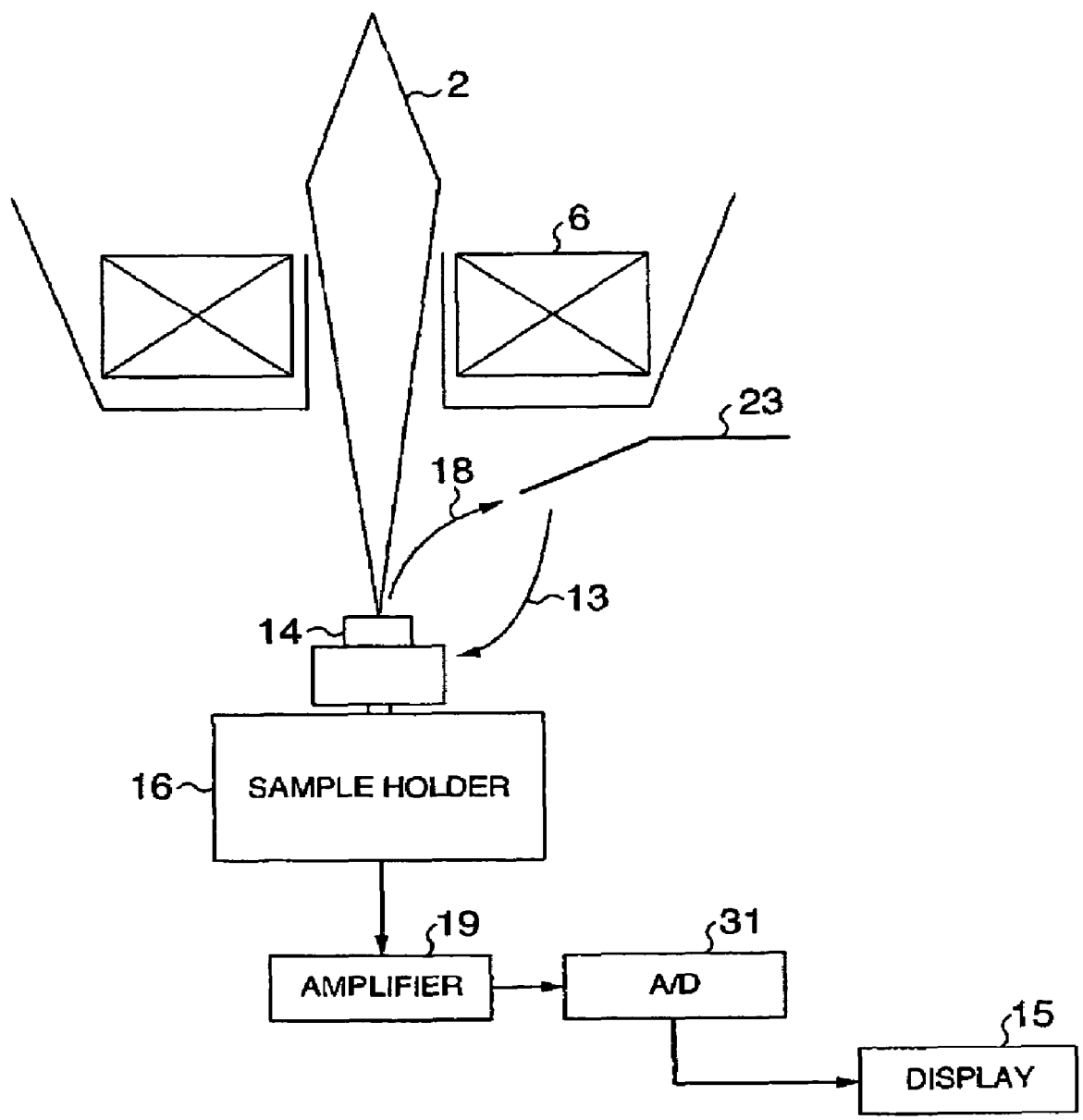
FIG. 9 in an enlarged view of an electric field supply electrode in the proximity of a sample holder.
Figure 10:
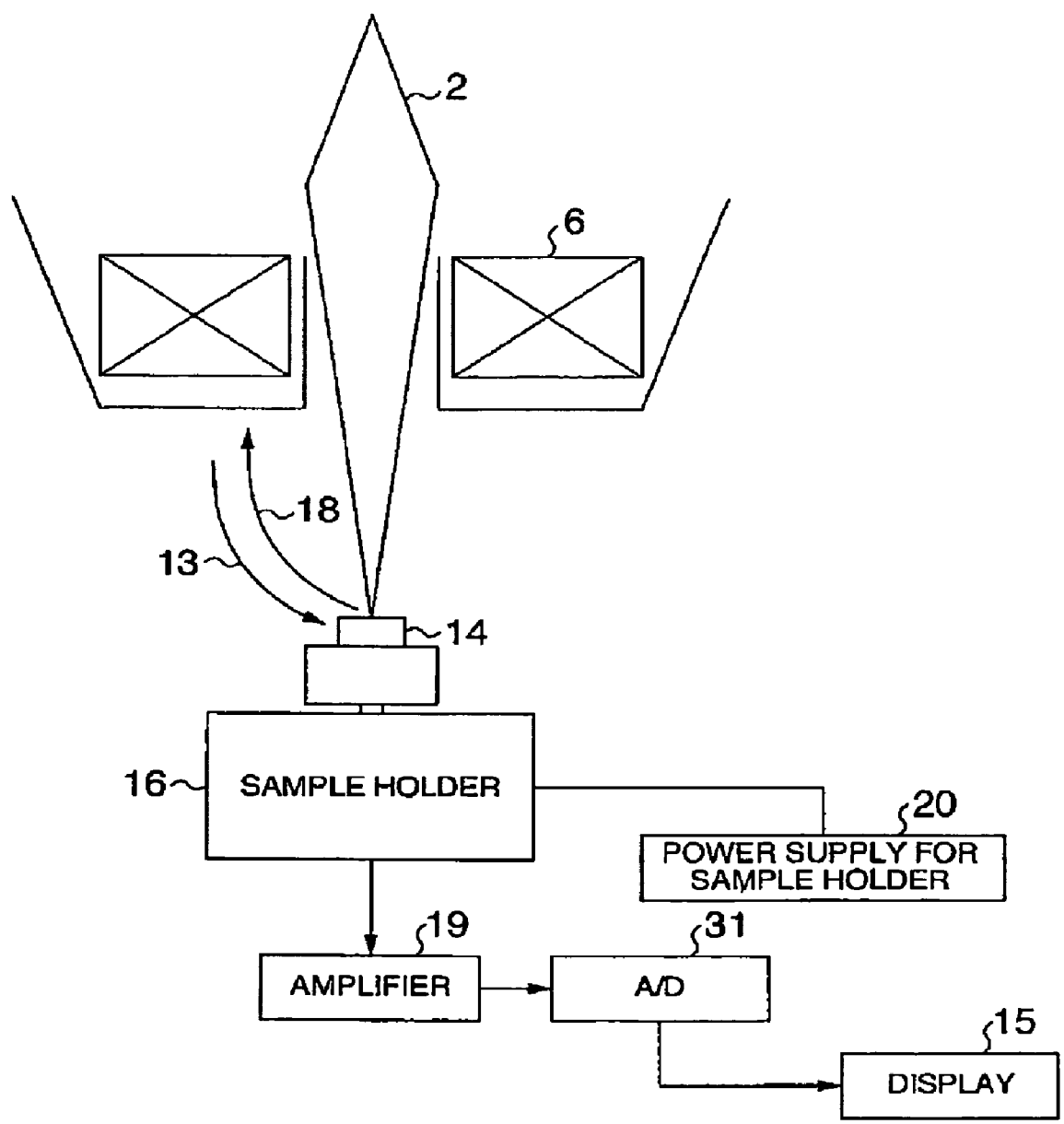
FIG. 10 in an enlarged view of an electric field supply electrode in the proximity of a sample holder of SEM according to the prior art.
Figure 11:
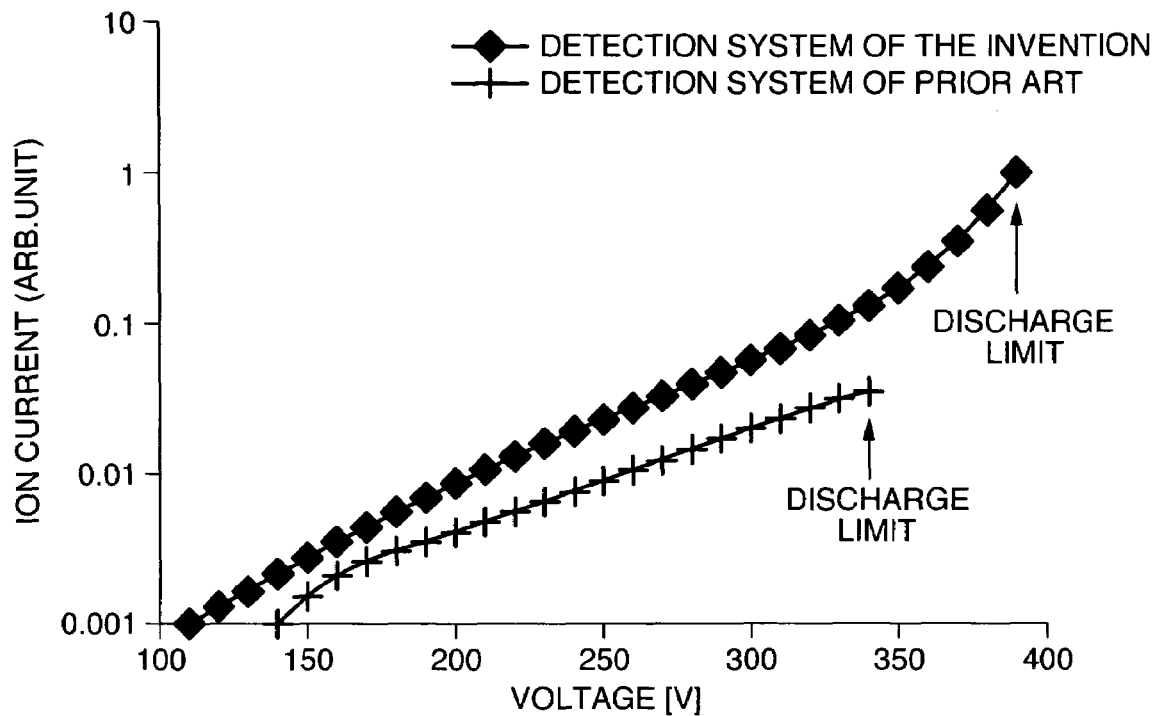
FIG. 11 shows a typical measurement example of an ion current of SEM according to one embodiment of the invention.

Next, the results of a series of experiments conducted to compare the detection system of the invention with that of the prior art will be explained. FIG. 11 shows a typical measurement example of the ion current by SEM of the embodiment of the invention shown in FIG. 1 and a typical measurement example of the ion current by SEM of the prior art shown in FIG. 9. The distance between the sample and the electric field supply electrode 11 and the distance between the sample and the ion current detection electrode are optimized to acquire the maximum yield of the ion current. The ordinate represents the relative value of the current measured by the ion current detection electrode 7 of the invention (relative value of ion current detected at sample holder in accordance with method disclosed in JP-2001-126655) and the abscissa represents the voltage applied to the electric field supply electrode. The measurement is carried out at a beam acceleration voltage: 25 kV, a beam quantity: 200 pA, W.D.: 25 mm, a gas pressure: 100 Pa and a sample: copper material. In the measurement, the ion current detection electrode 7 and the sample holder are kept at the ground potential. As shown in the graph, the ion current greater by dozens of times than the ion current quantity of the conventional detection system can be obtained in terms of the maximum value in the embodiment shown in FIG. 1. The response time can be improved by dozens of micro-sec owing to the reduction of the drift time of the ions. The residual gas inside the sample chamber is not limited to the atmosphere and a rare gas such as Ar, Xe, etc, or a nitrogen gas may be used by separately providing gas introduction means.

Figure 12:
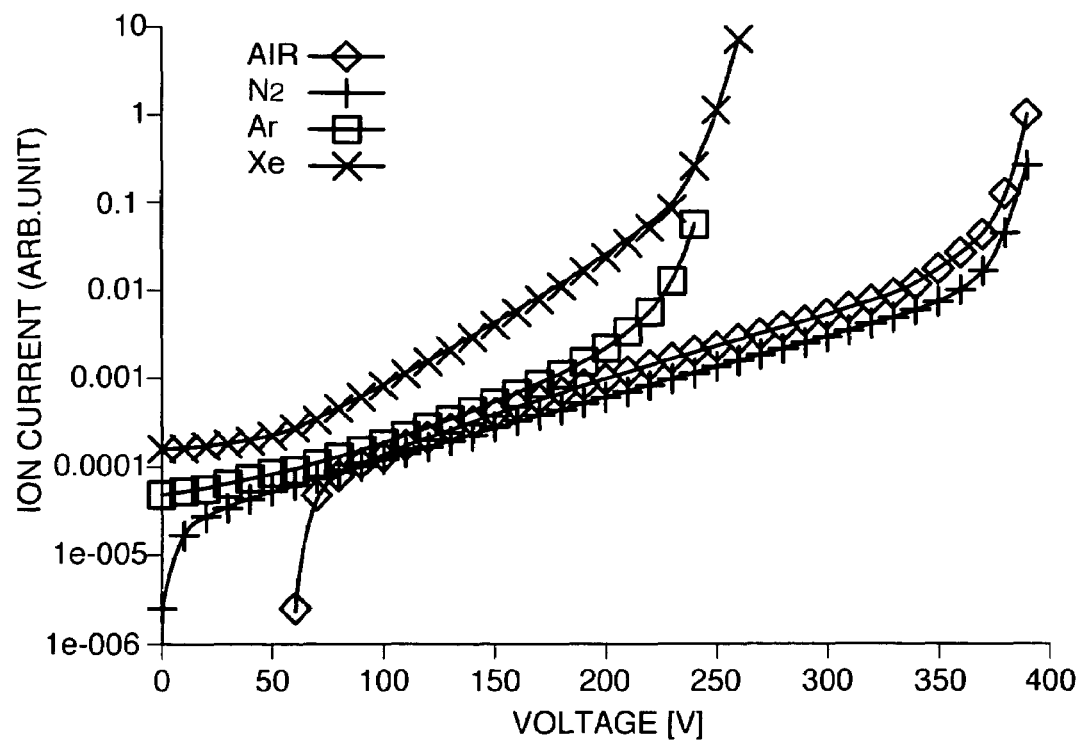
FIG. 12 shows ion current characteristics in different kinds of gas according to one embodiment of the invention.

FIG. 12 shows the measurement results of the ion currents measured by using the atmosphere, nitrogen, Ar and Xe, respectively. The gases other than the atmosphere are used as the residual gas in the following conditions, for example. In low vacuum SEM observation under a low vacuum condition of 1 to thousands of Pa, the degree of vacuum cannot be easily elevated if vapor enters the sample chamber when the sample chamber is set to the low vacuum condition. Therefore, invasion of vapor into the sample chamber is not desirable. For example, such a case corresponds to the case where the degree of vacuum inside the sample chamber is again elevated. In such a case, it is advisable to use the nitrogen gas having voltage-current characteristics extremely analogous to nitrogen and atmosphere. Because Ar and Xe have a greater ionization sectional area than the atmosphere molecules, a large ion current can be acquired at a relatively low voltage.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
   an irradiation optical system for irradiating an electron beam to a sample;
   a sample holder for supporting said sample, arranged inside a sample chamber;
   at least one electric field supply electrode arranged at a periphery of said sample holder; and
   an ion current detection electrode;
   wherein said electric field supply electrode is arranged such that said ion current detection electrode covers a part of said electric field supply electrode not opposed to said sample holder.

2. A scanning electron microscope comprising:
   an irradiation optical system for irradiating an electron beam to a sample;
   a sample holder for supporting said sample;
   a sample chamber having said sample holder arranged therein;
   an electric field supply electrode for supplying an electric field for accelerating secondary electrons generated from said sample by irradiating an electron beam; and
   an ion current detection electrode arranged inside said sample chamber, for detecting ions generated by impingement of said secondary electrons accelerated against a residual gas inside said sample chamber;
   wherein said ion current detection electrode has an upper electrode and a lower electrode, and said electric field supply electrode is arranged between said upper electrode and said lower electrode.

3. A scanning electron microscope according to claim 2, wherein said ion current detection electrode has a shape covering the periphery of said electric field supply electrode.

4. A scanning electron microscope according to claim 1, wherein the shape of either one, or both, of said electric field supply electrode and said ion current detection electrode is a mono-filament-like, mesh-like, porous sheet-like or sheet-like one.

5. A scanning electron microscope according to claim 1, further comprising:
   means for applying a voltage to said sample holder, said ion current detection electrode or said electric field supply electrode; and
   means for controlling said impressed voltage.

6. A scanning electron microscope according to claim 1, further comprising:
   a first electrode arranged inside said sample chamber, for forming an electrode field for imparting a desired speed to said secondary electrons generated from said sample by irradiating said electron beam.

7. A scanning electron microscope according to claim 1, further comprising:
   a second electrode, arranged inside said sample chamber, for supplying an electric field necessary for accelerating the secondary ions and causing gas multiplication by residual gas molecules, and for supplying an electric field for causing the ions or electrons generated by said gas multiplication to drift towards said sample being charged.

8. A scanning electron microscope according to claim 5, wherein said impressed voltage control means controls the impressed voltage to said first electrode.

9. A scanning electron microscope according to claim 1, further comprising:
   means for independently adjusting relative positions of said ion current detection electrode and said electric field supply electrode.

10. A scanning electron microscope according to claim 1, further comprising:
    means for adjusting a relative position of said ion current detection electrode or said electric field supply electrode with respect to said sample holder.

11. A scanning electron microscope according to claim 1, wherein said sample holder is used also as said ion current detection electrode.

12. A scanning electron microscope according to claim 1, wherein said electric field supply electrode or said ion current detection electrode can be used also as a secondary electron collector.

13. A scanning electron microscope according to claim 1, further comprising:
    an amplifier for amplifying the ion current detected from said ion current detection electrode to an intensity necessary for forming an image, arranged inside said sample chamber.

14. A scanning electron microscope according to claim 2, wherein said residual gas is an atmospheric air, a nitrogen gas or a rare gas.

15. A scanning electron microscope according to claim 7, wherein said impressed voltage control means controls the impressed voltage to said second electrode.

16. A scanning electron microscope comprising:
    an irradiation optical system for irradiating an electron beam to a sample;
    a sample holder for supporting said sample;
    a sample chamber having said sample holder arranged therein;
    an electric field supply electrode for supplying an electric field for accelerating secondary electrons generated from said sample by irradiating an electron beam; and
    an ion current detection electrode arranged inside said sample chamber, for detecting ions generated by impingement of said secondary electrons accelerated against a residual gas inside said sample chamber;
    wherein said ion current detection electrode is a cylindrical shape ion current detection electrode having an opening, and said electric field supply electrode is disposed inside the cylindrical shape electrode such that said electric field supply electrode is opposed to said sample holder via said opening of the cylindrical shape ion current detection electrode.

* * * * *